(12) United States Patent
Nikaido et al.

(10) Patent No.: US 7,887,336 B2
(45) Date of Patent: Feb. 15, 2011

(54) DOUBLE-SIDED CONNECTOR WITH PROTRUSIONS

(75) Inventors: Shinichi Nikaido, Sakura (JP); Katsuya Yamagami, Sakura (JP); Yasuhiro Ouchi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/493,760

(22) Filed: Jun. 29, 2009

(65) Prior Publication Data

US 2010/0081342 A1    Apr. 1, 2010

(30) Foreign Application Priority Data

Jun. 30, 2008   (JP)   ............... 2008-171004

(51) Int. Cl.
*H01R 12/00* (2006.01)
*H05K 1/00* (2006.01)

(52) U.S. Cl. .................. 439/66; 439/91; 439/591

(58) Field of Classification Search ............ 439/66, 439/91, 591
See application file for complete search history.

(56) References Cited

U.S. PATENT DOCUMENTS

| | | | | |
|---|---|---|---|---|
| 4,548,451 | A * | 10/1985 | Benarr et al. ............ | 439/85 |
| 5,759,047 | A * | 6/1998 | Brodsky et al. ............ | 439/66 |
| 6,142,789 | A * | 11/2000 | Nolan et al. ............ | 439/66 |
| 6,299,456 | B1 * | 10/2001 | Wark et al. ............ | 439/66 |
| 6,857,880 | B2 | 2/2005 | Ohtsuki et al. | |
| 6,897,568 | B2 * | 5/2005 | Haimerl et al. ............ | 257/779 |
| 6,939,143 | B2 * | 9/2005 | Rathburn ............ | 439/66 |
| 6,976,888 | B2 | 12/2005 | Shirai et al. | |
| 7,005,751 | B2 | 2/2006 | Khandros et al. | |
| 7,080,988 | B2 * | 7/2006 | Hedler et al. ............ | 439/66 |
| 7,083,429 | B2 | 8/2006 | Hashimoto et al. | |
| 7,549,870 | B2 * | 6/2009 | Mason et al. ............ | 439/66 |
| 7,549,871 | B2 * | 6/2009 | Pennypacker et al. ........ | 439/66 |
| 2008/0020624 | A1 * | 1/2008 | Nikaido et al. ............ | 439/342 |
| 2009/0197437 | A1 * | 8/2009 | Ouchi et al. ............ | 439/68 |

FOREIGN PATENT DOCUMENTS

| | | | |
|---|---|---|---|
| JP | 08-287893 | A | 11/1996 |
| JP | 08-287983 | A | 11/1996 |
| JP | 2001-332321 | A | 11/2001 |
| JP | 2003-124396 | A | 4/2003 |
| JP | 2004-71347 | A | 3/2004 |
| JP | 2004-509449 | A | 3/2004 |
| JP | 2004-158430 | A | 6/2004 |
| JP | 2005-19284 | A | 1/2005 |
| JP | 2006-525672 | A | 11/2006 |

* cited by examiner

*Primary Examiner*—Hae Moon Hyeon
(74) *Attorney, Agent, or Firm*—Sughrue Mion, PLLC

(57) ABSTRACT

A double-sided connector is provided including: an insulating member having an insulating substrate and an elastomer insert-molded on both faces of the insulating substrate, and a through-hole formed along a thickness direction of the insulating substrate and the elastomer; a conductive member formed on an inner face of the through-hole, both ends of the conductive member exposed at the both faces; and a contact terminal part provided at one end of the conductive member. A protrusion is formed on at least a first face of the two faces of the insulating member and near one of the two ends of the through-hole. The protrusion formed by a part of the elastomer protruding from the first face enables an approximately hemispherical point of contact part connected to the sloping part and covering the top.

9 Claims, 6 Drawing Sheets

DOUBLE-SIDED CONNECTOR WITH PROTRUSIONS

CROSS-REFERENCE TO RELATED APPLICATIONS

This application claims priority from Japanese Patent Application No. 2008-171004, filed Jun. 30, 2008, the contents of which are incorporated herein by reference.

BACKGROUND OF THE INVENTION

1. Field of the Invention

The present invention relates to a double-sided connector that, when an IC package such as a CPU or an LSI, an LGA package, a BGA package or the like is mounted on a printed circuit board, can absorb variations in the height of contact terminals, without generating warping in the package and the printed circuit board.

Priority is claimed on Japanese Patent Application No. 2008-171004, filed Jun. 30, 2008, the contents of which are incorporated herein by reference.

2. Description of Related Art

Conventionally, technology for mounting an integrated circuit (IC) package such as a central processing unit (CPU) or large scale integrated circuit (LSI) on a printed circuit board via a socket has been considered. For example, in most personal computers and servers, sockets are used to mount land grid array (LGA) or a ball grid array (BGA) package type of CPUs on their motherboards.

Recent years, in accordance with the improvements in the function and the performance of the CPUs, the number of pins, the working speed, and the package size has been increasing, and the pitches between the pins has been getting finer.

These developments of CPUs require the necessity of countermeasures for: a socket to accommodate the increasing number of pins; absorbing greater warping of the package generated by increasing size of the package; and absorbing variations in the heights (i.e., the coplanarity) of contact lands and solder balls of the package. Therefore, it is necessary to secure enough movable range of the pins of the socket contact.

In order to realize the finer pitches of the packages, size reduction in the socket contacts is important, and also it is necessary to assure contact with appropriate contact pressure between the pins of ICs and the socket contacts.

Furthermore, in order to respond to the higher working speed of the CPUs, it is important for the socket contacts to have a lower inductance. The socket contacts are also required to have a lower contact resistance and a larger permissible current in response to increasing current consumption caused by the higher working speed.

Most sockets for LGA packages presently used include 400 to 800 pins at a pitch of approximately 1 mm, and are manufactured by complexly folding a metal plate to form a socket contact having a predetermined shape and then by inserting the socket contact into a socket housing (see Japanese Unexamined Patent Application, First Publication No. 2004-158430 and Japanese Unexamined Patent Application, First Publication No. 2005-19284).

In the sockets having the above-mentioned structure, each of the metal socket contacts also serves as a plate spring which generates an appropriate load at a predetermined stroke to obtain a stable contact resistance. In addition, in this structure, while increasing the load applied on the socket contacts to obtain the predetermined contact pressure, a wiping effect can be obtained in which a contact point between the socket contact and the contact land of the IC moves, and thereby removing foreign bodies on surfaces of the socket contact and the contact land of the IC.

However, since this type of socket contact for an LGA package basically has a cantilever spring structure, it was difficult to realize finer pitches.

This is because the length of a cantilever spring portion of the socket contact needs to be shorter in order to realize the finer pitches. However, if the length of the cantilever spring portion having the same material and the same shape is shortened in relation to the original length, the load to be applied thereon for obtaining a predetermined stroke needs to be increased. If the wire diameter of the cantilever spring portion is reduced to an appropriate value to lower the load to be applied thereon, problems arises such as: the cantilever spring portion will deform in excess of an elastic deformation range thereof, and then will have a plastic deformation, when the predetermined load is applied; and the required allowable stress decreases and this results in incapable of withstanding the predetermined load. The reason for this is that, while in a range where the allowable stress is proportional to the wire diameter of the cantilever spring portion, the spring constant which determines the allowable load (or the load corresponding to the predetermined stroke) is proportional to the cube of the wire diameter of the cantilever spring portion.

Accordingly, instead of the above-mentioned structure which obtains the predetermined contact pressure using the cantilever spring portion, another structure is proposed in which: a metal contact portion is designed so as be capable of performing the plastic deformation; and applying a repulsive force to the metal contact portion by utilizing a rubber or an elastomer.

For example, a structure is proposed that uses a flexible printed circuit board to realize functions of the socket contact in which: an elastomer is sandwiched between two flexible printed circuit boards; and upper and lower layers of the flexible printed circuit boards are electrically connected by soldering metal pins (see Japanese Unexamined Patent Application, First Publication No. 2004-71347).

Also, another structure is proposed in which: a metal film is plated on an elastomer having predetermined dome-shaped portions and through-holes which were molded in a mold in advance; and a circuit that electrically connects the through-holes and contact points on the dome-shaped portions is formed by photolithography (see Japanese Unexamined Patent Application, First Publication No. 2001-332321).

Recent advancements in micro-mold technologies enable designing molds capable of molding at micron-order precision. If this type of mold is applied to the above-mentioned structure that plastically deforms the metal socket contact, and supplements the repulsive force with the rubber or the elastomer, it would be possible to collectively fabricate all or a plurality of the contact terminals each having a shape of a terminal on the elastomer, by batch process.

Therefore, all or a plurality of pins can be collectively formed by batch process, by photolithography and etching in a conductive circuit portion and a metal contact part of each terminal, after forming of conductive portions by plating and electrically connecting between layers by plating the through-holes. Therefore, it is in line with the market demand for a greater numbers of pins.

Furthermore, applying circuit-forming technologies by photolithography and etching are also suitable for obtaining finer pitches.

In the above-mentioned conventional structure where the elastomer is sandwiched between the two flexible circuit boards requires the two flexible circuit boards, the metal pins for electrically connecting between the layers, and soldering via metal pins between the two flexible circuit boards, and the like. Therefore, the manufacturing processes are consequently complex, and the manufacturing cost thereof is high.

In addition, in the above-mentioned structure including the elastomer formed with the dome-shaped portions and the through-holes, if this structure is pressed along the thickness direction thereof, the dome-shaped portions will be deformed in accordance with the load applied thereon and may be collapsed. In such case, the wiping effect cannot be expected although it is required as one of the functions of the socket contact. In addition, increasing the number of pins necessitates absorbing: warping of the printed circuit board and the IC package; and variations in the height of the contact lands. However, in the above-mentioned structure, the amount of motion for absorbing the warping and variations in the coplanarity is limited by the height of the dome-shaped portion.

Furthermore, in the above-mentioned structure in which: the metal film is plated on the elastomer; and the circuit that electrically connects between the through-holes and contact points on the dome-shaped portions is formed by photolithography, stress may be generated and concentrated in a part of the metal plating portion on the elastomer.

Furthermore, in the above-mentioned structure where the metal film is plated on the elastomer, since the movable range of the point of contact part is limited by the range of deformation of the elastomer along its thickness direction, enlargement of the movable range cannot be expected.

The present invention was made in view of the above-mentioned circumstances, and has an object of providing a double-sided connector which can absorb variations in the height of point of the contact part caused by warping of the package and the printed circuit board and the variations in the height of the contact terminals, which can reduce concentration of stress in the through-holes which electrically connect between the layers, which can enlarge the movable range of the point of contact part, and which can thereby meet the recent demand for finer pitches.

SUMMARY OF THE INVENTION

To solve the above-mentioned problems and thereby achieving the objects, the present invention employs the following.

(1) A double-sided connector of the present invention is provided with: an insulating member having an insulating substrate and an elastomer insert-molded on both faces of the insulating substrate, and a through-hole formed along a thickness direction of the insulating substrate and the elastomer; a conductive member formed on an inner face of the through-hole, both ends of the conductive member exposed at the both faces; and a contact terminal part provided at one end of the conductive member, wherein: a protrusion is formed on at least a first face of the two faces of the insulating member and near one of the two ends of the through-hole, the protrusion formed by a part of the elastomer protruding from the first face; and the contact terminal part includes a ring part formed around the end of the through-hole on the first face, a sloping part connected to the ring part and extended slantingly toward a top of the protrusion, and an approximately hemispherical point of contact part connected to the sloping part and covering the top.

According to the double-sided connector, since the elastomer composing the first face of the insulating member has elasticity, the point of contact part can move across wide range with respect to the first face of the insulating member.

Further, since the point of contact part is hemispherical, the point of contact part contacts the other conductive member (which is the contact pad of an LGA package or the solder ball of a BGA package) by one point. This enables ensuring sufficient contact pressure since the load can be concentrated only at this point of contact. Moreover, since the point of contact part is hemispherical, it has sufficient rigidity enough to prevent the possibility of being collapsed even when the load is concentrated thereat.

Since the point of contact part which is the movable portion of the contact terminal part, is at a distance from the through-hole for interlayer conduction, stress will not be concentrated at the point of contact part and the through-hole, and hence there is a low possibility of collapsing them.

Therefore, the point of contact part can secure a wide movable range without affecting on the design of the point of contact part. This eliminates any possibility of warping of the package and the printed circuit board, absorbs any variations in the height of the contact terminals, and thereby allowing the finer pitches.

Further, since the protrusion and the approximately hemispherical point of contact part provided thereon can be formed collectively by batch process, the number of elements can be small.

(2) The protrusion and the contact terminal part may be further provided on a second face of the two faces of the insulating member.

In this case, even in a case where the package or the printed circuit board are arranged on each of the two faces of the insulating member, there is no possibility of generating warping of the package and the printed circuit board. Therefore, variations in the height of the contact terminals can be absorbed.

(3) The double-sided connector may be further provided with a soldered part provided on a second face of the two face of the insulating member, which is positioned on a reverse side of the protrusion formed on the first face, and which is electrically connected to the conductive member.

In this case, a more reliable electrical contact with the conductive member (which is the contact pad of an LGA package or the solder ball of a BGA package) can be achieved by connecting via the soldered part.

(4) A dividing part between a sidewall of the protrusion and the plane around the protrusion of the first face may have a curved shape in a cross section along the thickness direction.

(5) The diameter of the ring part may be greater than at least the width of the sloping part.

(6) The angle of the sloping part with respect to the plane around the protrusion of the first face may be equal to or less than 45°.

In this case, there is no possibility of causing too wide separation of the sloping part with respect to the first face. Therefore, the contact terminal part can move reliably within a predetermined range with respect to the insulating member.

(7) It may be arranged such that: a plurality of the contact terminal parts is provided on at least the first face; and adjacent contact terminal parts are arranged so as to be electrically independent from each other.

In this case, the contact terminal parts can move independently from each other while electrically connecting with each corresponding contact pad and/or solder ball.

(8) An extension direction of the contact terminal part may slope with respect to a direction along a virtual line between the nearest points of contact.

In this case, the contact terminal part and the through-hole can be arranged efficiently in a fixed area.

(9) A sidewall of the protrusion may slope with respect to the plane around the protrusion of the first face.

DETAILED DESCRIPTION OF THE INVENTION

Preferred embodiments for realizing the double-sided connector of the present invention will be explained below.

The following embodiments are intended to facilitate understanding of the essence of the present invention, and should not be considered as limiting the present invention unless otherwise stated.

First Embodiment

Figure 1:
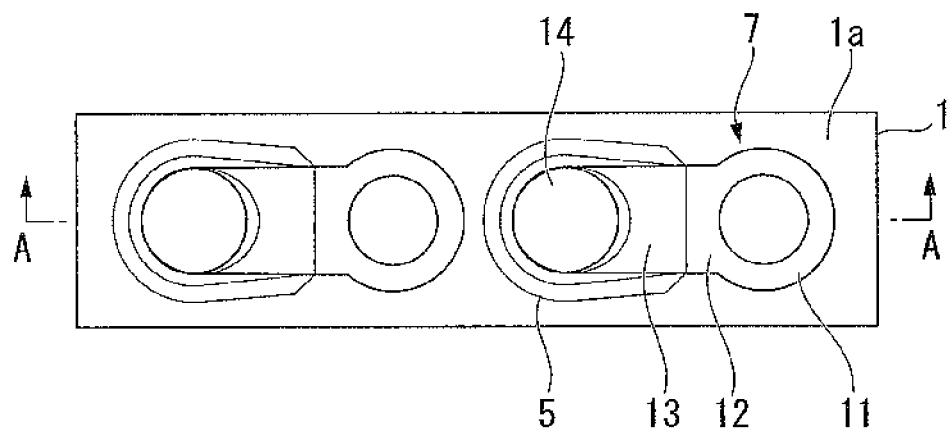
FIG. 1 is a plan view of a double-sided connector according to a first embodiment of the present invention.
Figure 2:
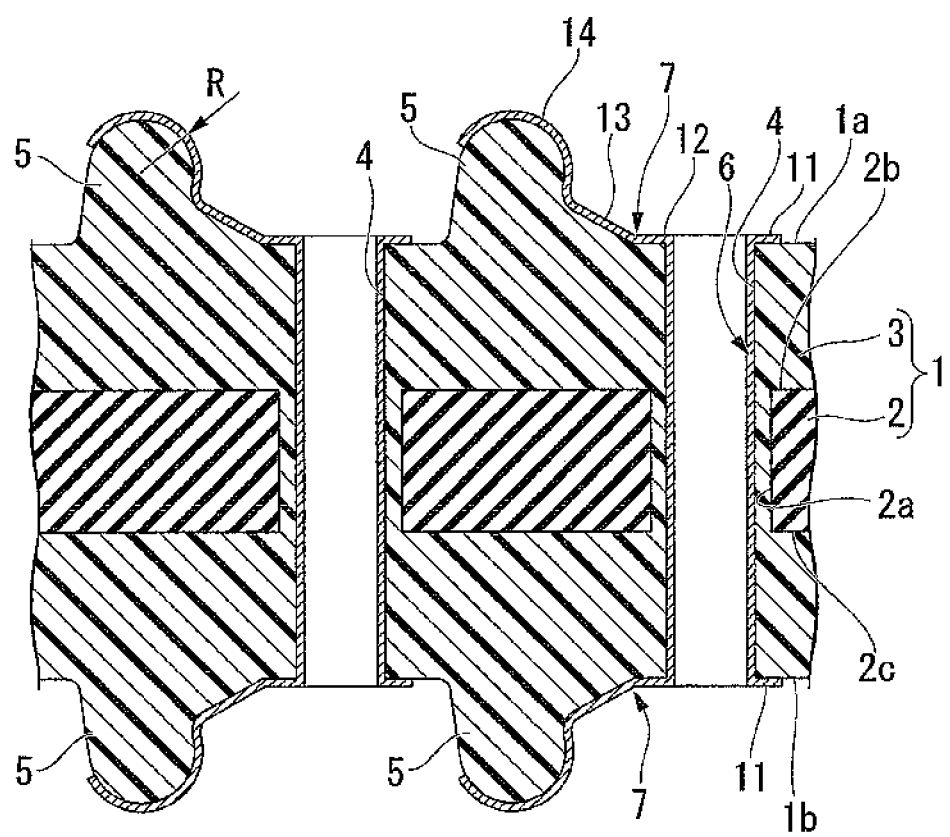
FIG. 2 is a cross-sectional view taken along the line A-A of FIG. 1.

FIG. 1 is a plan view of a double-sided connector according to a first embodiment of the present invention, and FIG. 2 is a cross-sectional view taken along the line A-A of FIG. 1.

In these FIGS. 1 and 2, reference numeral 1 represents an insulating member. The insulating member 1 is composed of: an insulating substrate (an insulating material) 2 which has holes 2a which are formed in advance at the positions where through holes 4 are to be formed; and a film or sheet elastomer 3 which is insert-molded with the insulating substrate 2 so as to cover all of a top face 2b, a bottom face 2c, and the holes 2a of the insulating substrate 2, and which has a predetermined thickness.

A plurality of the through-holes 4 (two of them are shown in FIGS. 1 and 2) is formed in the insulating member 1, and penetrates the insulating member in its thickness direction. On a top face 1a and a bottom face 1b of the insulating member 1, approximately hemispherical protrusions 5 made of elastomer are arranged near opening ends of the through-holes 4, and protrude from the top face 1a and the bottom face 1b of the insulating member 1.

In the present embodiment, the through-holes 4 are placed at a distance from the dividing line between the bottom of the each protrusion 5, and the top face 1a or the bottom face 1b of the insulating member 1.

Preferably, sidewalls of the protrusions 5 are sloping in some degree. This is to eliminate blind spot during the exposure process which is required to form contact terminal parts 7 which will be described later. Normally, the sidewalls preferably have a sloping angle of 10 degrees or more with respect to a vertical line on the top face 1a. Preferably, the shape of the sidewalls does not have any sharp edges. This is to prevent disturbance of fluid-flow during processes of development, etching, removing a resist, and the like, at the formation of the contact terminal part 7.

A bottom portion of the each protrusion 5 has a curved-shape of a curvature radius R in a cross section along the thickness direction of the insulating member 1.

A conductive part 6 made of metal (conductive member) such as copper, aluminum, or silver-palladium alloy, is formed over the inner face of the each through-hole 4 with a predetermined thickness. The contact terminal parts 7 formed by processing a plating film of the same metal as the conductive part 6 are formed by photolithography and etching processes at both ends of the conductive part 6.

These contact terminal parts 7 are arranged on both of the top face 1a and the bottom face 1b, so as to be symmetrical with respect to the insulating member 1.

Figure 3:
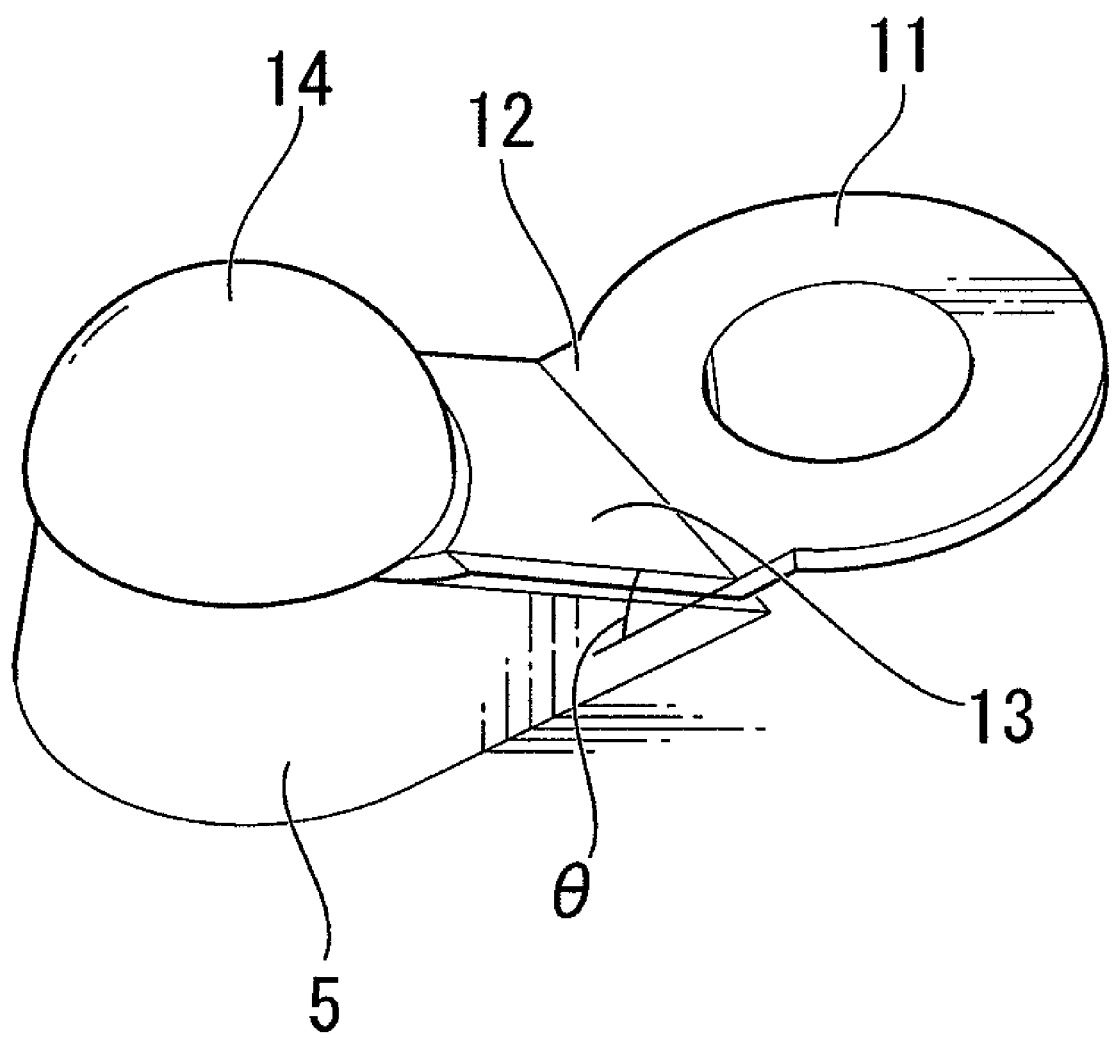
FIG. 3 is a perspective view of a contact terminal part of the double-sided connector.

As shown in FIGS. 2 and 3, each of the contact terminal parts 7 is composed of: a land part (ring part) 11 that is a ring-shaped plate member formed on the top face 1a or the bottom face 1b of the insulating member 1 at the opening end on of the through-hole 4; a flat and strip-shaped connection part 12 that is continuous with the land part 11 and extends horizontally toward the protrusion 5; a strip-shaped sloping part 13 that is continuous with a portion of a periphery of the connection part 12 and extends slantingly toward the top of the protrusion 5; and a point of contact part 14 made of an approximately hemispherical metal film that is continuous with an end of the sloping part 13 and covers the top of the protrusion 5.

In order to have stable deformation of the entire contact terminal part 7 and obtain the effective wiping effect, the angle θ between the sloping part 13 and the top face 1a (or bottom face 1b) of the insulating member 1 (in other words, the angle between the sloping part 13 and an extension line of the connection part 12) is preferably equal to or less than 45°, and more preferably around 30°. It is not preferable to adopt the angle θ of less than 30° because it would result in difficulty in securing the sufficient total height of the contact terminal part 7.

By adopting the angle θ of 45° or less, it is possible to prevent the sloping part 13 departing too far from the top face 1a (or the bottom face 1b) of the insulating member 1, and thereby preventing the difficulties in that the contact terminal part 7 cannot be returned to its original position. Therefore, the contact terminal part 7 can move reliably toward the top face 1a (or the bottom face 1b) of the insulating member 1.

The point of contact part 14 is made of, for example, a metal film having a laminated structure including two or more layers. For example, it is preferable to adopt the point of contact part 14 made of a metal film of a three-layer structure including: a conductive metal layer such as copper having superior conduction and formed on the protrusion 5; an intermediate metal layer such as nickel formed on this conductive layer; and a metal layer for point of contact such as a noble metal that is appropriate for a point of contact and is formed on the intermediate metal layer.

The point of contact part 14 is made from an approximately hemispherical metal film; therefore, the rigidity thereof is strengthened so that, even when a load is applied thereon, the point of contact part 14 is hardly deformed and thus can maintain the approximately hemispherical shape.

By adopting the point of contact part 14 of the approximately hemispherical shape, even when it contacts a contact terminal of a package or a printed circuit board, the point of contact part 14 can slide smoothly with respect to the contact terminal, and thereby preventing the concentration of stress applied on a part of the contact terminal by the point of contact part 14.

For example, when a load of 50 gf is applied on the contact terminal part, the load is also applied on the point of contact part 14, whereby the sloping part 13 connected to the point of contact part 14 rotates around the dividing line between the connection part 12 and the sloping part 13. During this motion, since the point of contact part 14 and the sloping part 13 are pressed outward by the elastic force by the elastomer 3 that is contacting them, the point of contact part 14 can obtain a reliable contact with the contact terminal, and thereby ensuring good electrical contact therebetween.

The diameter of the ring part 11 of the contact terminal part 7, arranged on the through-hole 4 is larger than the width of other portions of the contact terminal part 7.

Considering the permanent set, a distortion rate of the elastomer 3 is preferably equal to or less than 25%. In particular, the compression range used for the total thickness of the elastomer 3 below the point of contact part 14 is preferably equal to or less than 25%.

A portion of the elastomer 3 that forms the sidewall of the protrusion 5 is sloping with respect to the top face 1a or the bottom face 1b of the insulating member 1.

A mounting method using the double-sided connector of the present embodiment will be explained below, using an example where a semiconductor chip is mounted on a printed circuit board.

Figure 4:
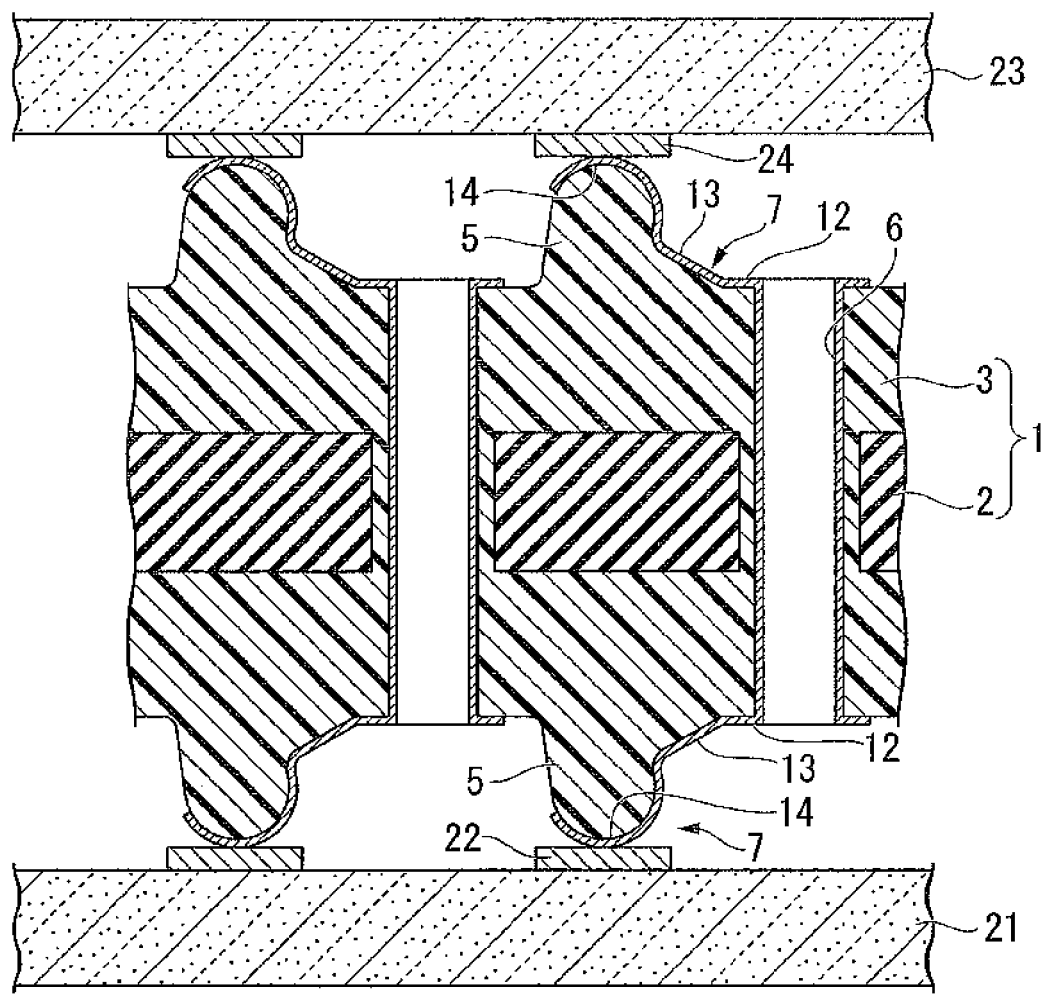
FIG. 4 is a cross-sectional view corresponding to FIG. 2, showing a mounting method using the double-sided connector.

Firstly, as shown in FIG. 4, the point of contact part 14 on the lower side of the double-sided connector is placed on a contact pad 22 of a printed circuit board 21, and a contact pad 24 of a semiconductor chip 23 is placed on the point of contact part 14 on the upper side of the double-sided connector.

In this situation, since no load is applied on the point of contact part 14 on the upper side, the point of contact part 14 and the sloping part 13 do not rotate around the dividing line between the connection part 12 and the sloping part 13, and therefore remain at their original positions. Therefore, each of the point of contact parts 14 shown in FIG. 4 is in contact at one point with the contact pads 22 of the printed circuit board 21 or with the contact pads 24 of the semiconductor chip 23.

Figure 5:
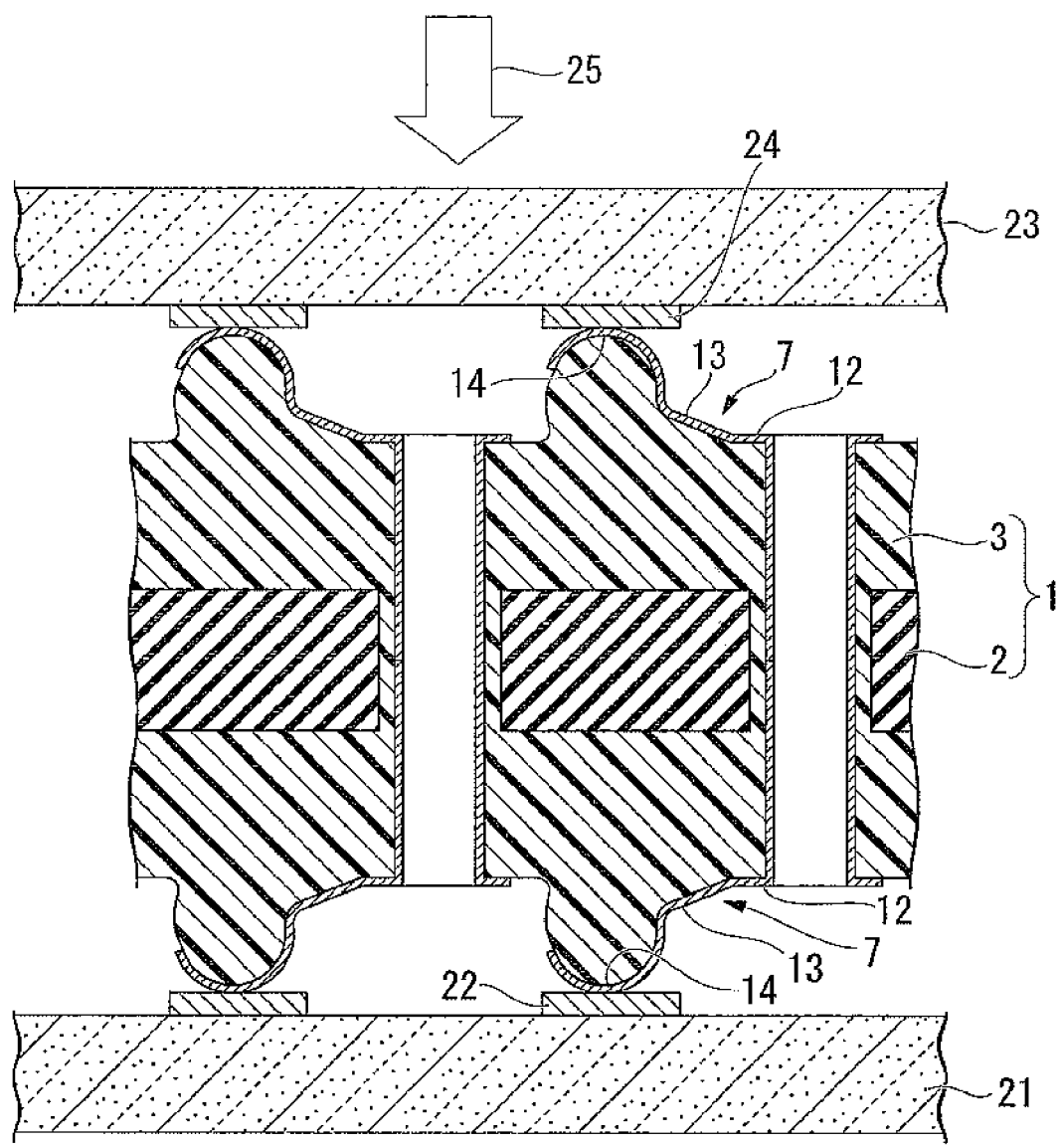
FIG. 5 is a cross-sectional view corresponding to FIG. 2, showing a mounting method using the double-sided connector.

Next, as shown in FIG. 5, while each of the point of contact parts 14 in contact at one point with the corresponding contact pad 22 of the printed circuit board 21 or the corresponding contact pad 24 of the semiconductor chip 23, a load 25 is applied from the semiconductor chip 23 to the printed circuit board 21.

Then, the dividing portion between the connection part 12 and the sloping part 13 deforms. As a result, the point of contact part 14 and the sloping part 13 of the contact terminal part 7 rotate around the dividing portion as their rotational axis. Along with this rotation, the point of contact part 14 slides smoothly over the contact pad 22 and, when the elastomer 3 is compressed, the point of contact part 14 obtains a repulsive force by the compressed elastomer 3.

As a result, the contact position of the point of contact part 14 that is in contact at one point with the contact pad 22 of the printed circuit board 21 moves on the contact pad 22, while being pressed against the contact pad 22 by the repulsive force by the elastomer 3.

Similarly, the contact position of the point of contact part 14 that is in contact at one point with the contact pad 24 of the semiconductor chip 23 moves on the contact pad 24, while being pressed against the contact pad 24 by the repulsive force by the elastomer 3.

In this manner, when the load 25 is applied on the point of contact part 14, the approximately hemispherical portion of the point of contact part 14 does not deform, and thereinstead, the dividing portion between the connection part 12 and the sloping part 13 deforms. As the point of contact part 14 and the sloping part 13 rotate around the dividing portion as the rotational axis thereof, the elastomer 3 below them is compressed and deforms. In addition, since the point of contact part 14 is connected via the sloping part 13 and the connection part 12 to the land part 11, the point of contact position of the point of contact part 14 on the contact pad 22 (24) moves along an arc-shaped trajectory so as to depart from the land part 11.

Accordingly, during the above sliding motion, the point of contact part 14 on which the load 25 is applied contacts the contact pad 22 (24) at a new contact position, and thereby enabling the wiping effect.

In addition, in the present embodiment, the dividing line between the bottom of the protrusion 5 and the top face 1a or the bottom face 1b of the insulating member 1 is distanced from the position of the through-hole 4, and the sloping part 13 of the contact terminal part 7 is formed so as to gradually and slantingly rise. Consequently, when the load 25 is applied on the point of contact part 14, the sloping part 13 deforms along the arc-shaped trajectory around a connection between the sloping part 13 and the connection part 12, such that the angle between the sloping part 13 and the top face 1a or the bottom face 1b becomes an obtuse angle; therefore, concentration of stress can be avoided.

Since the sloping part 13 of the contact terminal part 7 has the slantingly rising shape, the thickness of the elastomer 3 directly below the point of contact part 14 can be thicker than that at near the through-hole 4. Therefore, even when the elastomer 3 directly below the point of contact part 14 is compressed to obtain a predetermined compression stroke, the compression set for its total thickness can be smaller. In addition, with this construction, it is also possible to enhance resilience in regard to permanent set of the elastomer 3. Furthermore, by adopting the thinner thickness of the elastomer 3 at a portion near the through-hole 4, it is also possible to improve the resistance properties of the elastomer 3 against repeated bending and thermal shock.

As has been described above, the double-sided connector of the present embodiment includes the approximately hemispherical protrusions 5 made of elastomer, and arranged near the opening ends of the through-holes 4 formed in the top face 1a and the bottom face 1b of the insulating member 1. In addition, the conductive part 6 is formed so as to cover the inner face of the each through-hole 4, and the contact terminal part 7 including the land part 11, the connection part 12, the sloping part 13, and the point of contact part 14 is formed on the top face 1a (or bottom face 1b) of the insulating member 1 formed with the protrusion 5. With this construction, the sloping part 13 and the point of contact part 14 can rotate in a wide range around the land part 11 and the connection part 12.

Further, since the point of contact part 14 is approximately hemispherical, the point of contact part 14 will be in contact at one point with the contact pad 22 of the printed circuit board 21 or with the contact pad 24 of the semiconductor chip 23, and the load 25 applied onto the semiconductor chip 23 will concentrate in each of the point-contact portions. Accordingly, each of the point of contact parts 14 can secure a sufficient contacting pressure at each of the point-contact. Moreover, since the point of contact part 14 is approximately hemispherical, the rigidity of the point of contact part 14 is high enough to prevent collapse thereof when the load 25 is concentrated there.

Since the dividing portion between the connection part 12 and the sloping part 13, which is the center of a rotating motion of the sloping part 13 and the point of contact part 14, is distanced from the through-hole 4 for interlayer conduction, stress does not concentrate in the dividing portion between the connection part 12 and the sloping part 13 or in the through-hole 4. Therefore, these positions will not be damaged.

Therefore, the point of contact part 14 can secure a wide rotating range in the thickness direction of the insulating member 1, without affecting on the design of the point of contact part 14. This eliminates any possibility of problems such as warping of the printed circuit board 21 and the semiconductor chip 23, absorbs any variations in the height of the contact terminal parts 7, and allows finer pitching.

Also, the thickness of the elastomer 3 at the position of the through-hole 4 for interlayer conduction can be thinner than that at the position of the protrusion 5.

Also, since the protrusion 5 and the approximately hemispherical point of contact part 14 provided thereon can be formed collectively, the number of elements can be small.

Also, the load-displacement characteristics of the position of the protrusion 5 can be controlled by changing the shape of the protrusion 5 and the material of the elastomer 3.

Also, a portion of the contact terminal part 7 on the top of the protrusion 5 is formed by a metal layer including noble metal and the like that is suitable for a point of contact; therefore, contact resistant at the point of contact part 14 can be smaller.

Second Embodiment

Figure 6:
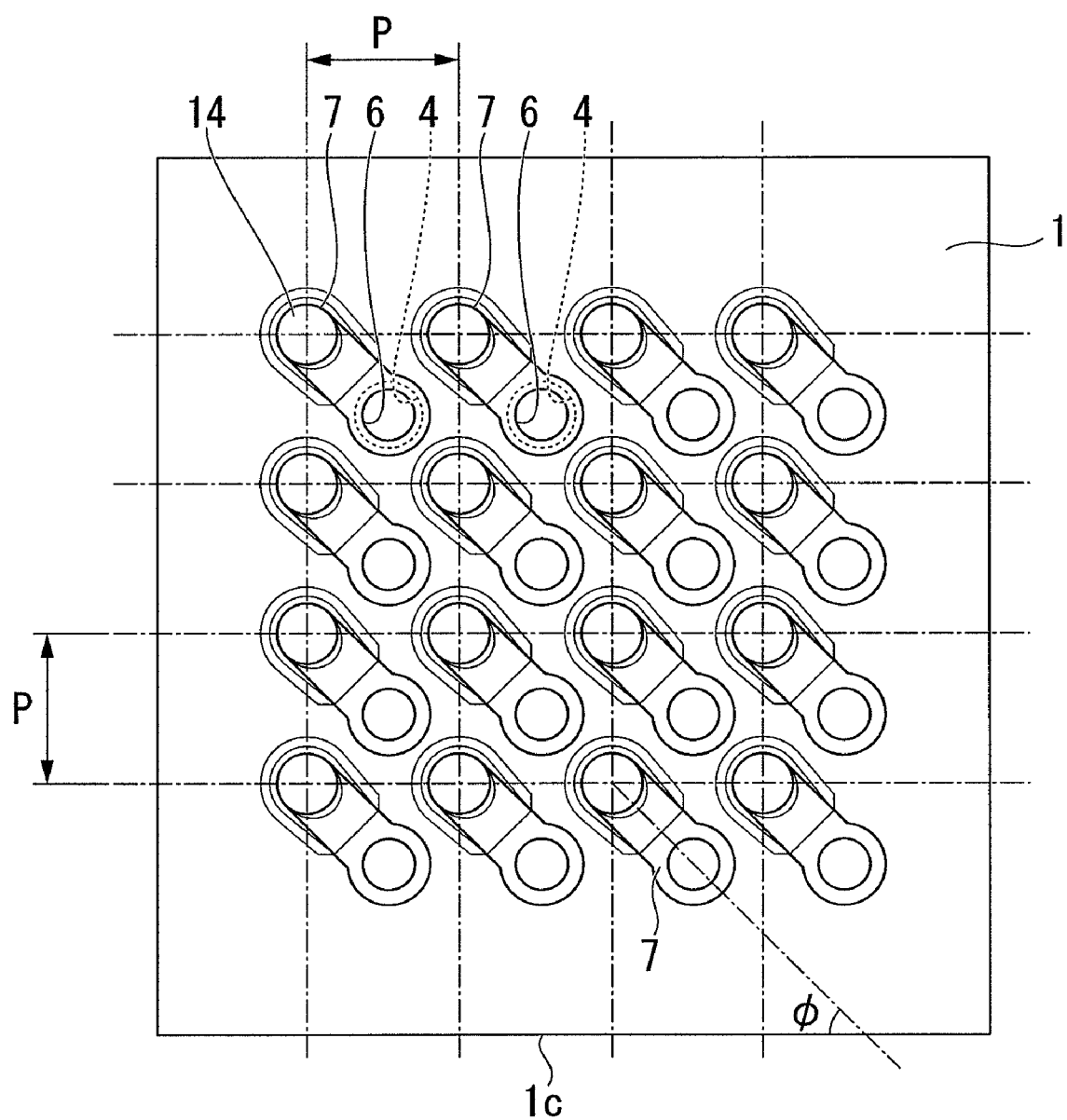
FIG. 6 is a plan view of a double-sided connector according to a second embodiment of the present invention.

FIG. 6 is a plan view of a double-sided connector according to a second embodiment of the present invention.

The double-sided connector of the present embodiment differs from that of the first embodiment in that the through-holes 4 are arranged in a matrix of four rows and four columns on one face of the insulating member 1 at an inter-terminal pitch P. In addition, each of the contact terminal parts 7 is formed at the corresponding conductive part 6 covering the through-hole 4 and, instead of connecting adjacent contact terminal parts 7, they are formed so as to be independent from each other. When the above-mentioned one face of the insulating member 1 is seen in front view, the angle ø between the extending direction of the contact terminal parts 7 and a side 1c of the insulating member 1 is 45 degrees.

The inter-terminal pitch P is, for example, 1 mm. In this case, approximately 0.5 mm can be used for the width of the contact terminal part 7, and thus 0.25 mm can be used for the radius of the point of contact part 14.

Further, when the above-mentioned one face of the insulating member 1 is seen in front view, the angle ø between the extending direction of the contact terminal parts 7 and the side 1c of the insulating member 1 is 45 degrees. The reason for this arrangement is to secure longer total length of the strip-shaped connection part 12 and the strip-shaped sloping part 13, of the contact terminal part 7. With this configuration, when the contact terminal part 7 is deformed by receiving the load applied thereon, stress generated at a portion serving as a rotational axis of the rotating motion of the contact terminal part 7 can be greatly reduced.

Thus, by arranging the contact terminal parts 7 such that, when one face of the insulating member 1 is seen in front view, the angle ø between the extending direction of the contact terminal parts 7 and the side 1c of the insulating member 1 becomes 45 degrees, the contact terminal parts 7 and the through-holes 4 can be arranged effectively so that the strip-shaped portion of the contact terminal part 7 can be longer.

Furthermore, since the adjacent contact terminal parts 7 are mutually independent so as not to be electrically connected together, each of the contact terminal parts 7 can move independently, and can have electrical connection independently.

Third Embodiment

Figure 7:
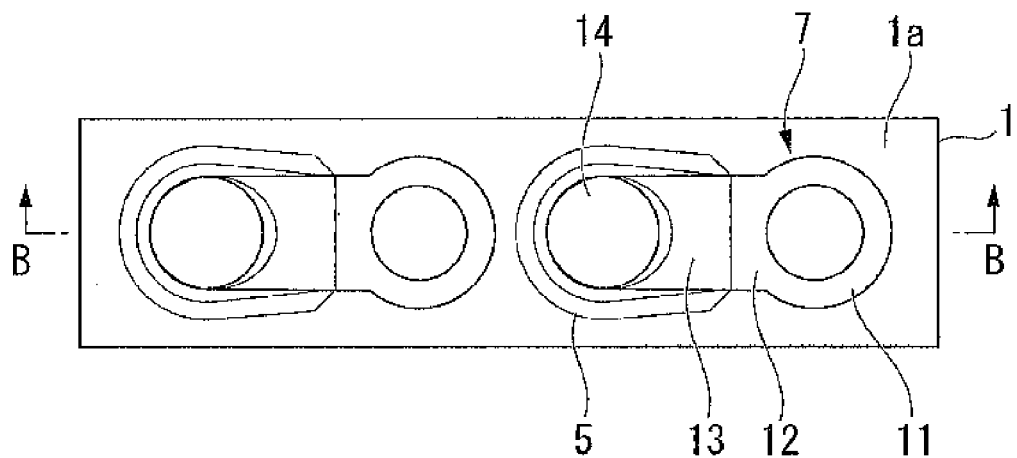
FIG. 7 is a plan view of a double-sided connector according to a third embodiment of the present invention.
Figure 8:
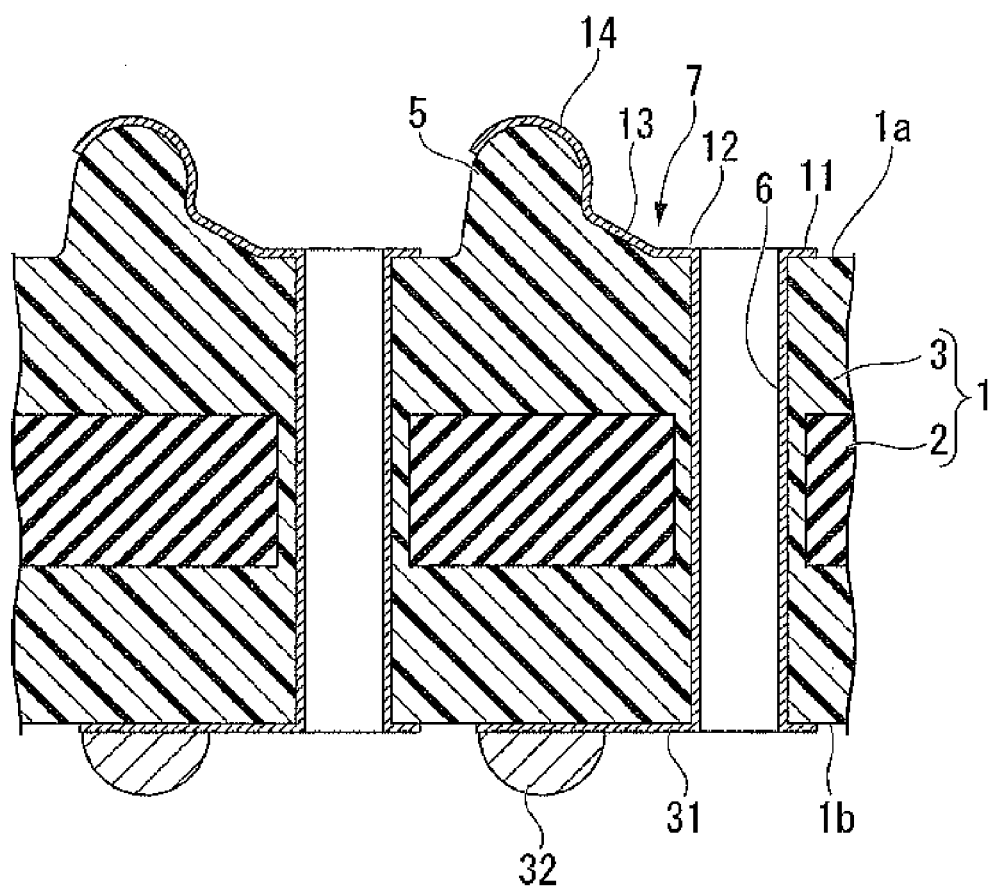
FIG. 8 is a cross-sectional view taken along the line B-B of FIG. 7.

FIG. 7 is a plan view of a double-sided connector according to a third embodiment of the present invention. FIG. 8 is a cross-sectional view taken along the line B-B of FIG. 7.

The double-sided connector of the present embodiment differs from that of the first embodiment in that: a terminal part 31 which is electrically connected to the conductive part 6 is formed near the opening end part of the each through-hole 4 on the bottom face 1b of the insulating member 1; and a soldered part 32 is formed on the each of terminal part 31.

As shown in this construction where the soldered parts 32 are formed on the bottom face 1b of the insulating member 1, the double-sided connector of the present embodiment can be applied not only for the construction where both of the top face 1a or the bottom face 1b have the point of contact structures, but also for the construction where one of the top face 1a or the bottom face 1b has solder-mounting structure.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A double-sided connector comprising:
   an insulating member having an insulating substrate of substantially uniform thickness and an elastomer insert-molded on both faces of the insulating substrate, and a through-hole formed along a thickness direction of the insulating substrate and the elastomer;
   a conductive member formed on an inner face of the through-hole, both ends of the conductive member exposed on both faces of the insulating member; and
   a contact terminal part provided at one end of the conductive member, wherein:
   a protrusion is formed on at least a first face of the two faces of the insulating member and near one of the two ends of the through-hole, the protrusion formed by a part of the elastomer protruding from the first face; and
   the contact terminal part includes
      a ring part formed around the end of the through-hole on the first face,
      a sloping part connected to the ring part and extended slantingly toward a top of the protrusion, and
      an approximately hemispherical point of contact part connected to the sloping part and covering the top.

2. The double-sided connector according to claim 1, wherein
   the protrusion and the contact terminal part are further provided on a second face of the two faces of the insulating member.

3. The double-sided connector according to claim 1, further comprising a soldered part provided on a second face of the two faces of the insulating member, which is positioned on a reverse side of the protrusion formed on the first face, and which is electrically connected to the conductive member.

4. The double-sided connector according to claim 1, wherein
a dividing part between a sidewall of the protrusion and a plane around the protrusion of the first face has a curved shape in a cross section along the thickness direction.

5. The double-sided connector according to claim 1, wherein
a diameter of the ring part is greater than at least a width of the sloping part.

6. The double-sided connector according to claim 1, wherein
an angle of the sloping part with respect to a plane around the protrusion of the first face is equal to or less than 45°.

7. The double-sided connector according to claim 1, wherein:
a plurality of the contact terminal parts is provided on at least the first face; and
adjacent contact terminal parts are arranged so as to be electrically independent from each other.

8. The double-sided connector according to claim 1, wherein
an extension direction of the contact terminal part slopes with respect to a direction along a virtual line between the nearest points of contact.

9. The double-sided connector according to claim 1, wherein
a sidewall of the protrusion slopes with respect to a plane around the protrusion of the first face.

* * * * *